United States Patent [19]
Grammel

[11] Patent Number: 6,121,832
[45] Date of Patent: Sep. 19, 2000

[54] INTERMEDIATE AMPLIFIER DEVICE FOR A TRANSMISSION NETWORK

[75] Inventor: Gert Grammel, Uhingen, Germany

[73] Assignee: Alcatel, Paris, France

[21] Appl. No.: 09/197,728

[22] Filed: Nov. 20, 1998

[30] Foreign Application Priority Data

Nov. 21, 1997 [DE] Germany ............................ 197 51 645

[51] Int. Cl.[7] .................................................. H03F 1/14
[52] U.S. Cl. ........................................ 330/51; 330/124 R
[58] Field of Search ................................ 330/51, 124 R, 330/124 D, 298, 207 P

[56] References Cited

U.S. PATENT DOCUMENTS

| | | | |
|---|---|---|---|
| 3,719,774 | 3/1973 | Kraaijenbrink | 178/6 |
| 4,150,339 | 4/1979 | Sueyoshi et al. | 330/298 |
| 4,173,740 | 11/1979 | Nagata et al. | 330/207 P |
| 4,227,227 | 10/1980 | Yamaguchi | 330/207 P |
| 4,288,755 | 9/1981 | Sakai | 330/298 |
| 4,379,209 | 4/1983 | Sakano | 330/298 |
| 4,486,720 | 12/1984 | Hirano | 330/51 |
| 4,558,358 | 12/1985 | Onda | 358/86 |
| 5,194,821 | 3/1993 | Brambilla et al. | 330/51 |
| 5,847,610 | 12/1998 | Fujita | 330/298 |

FOREIGN PATENT DOCUMENTS

| | | |
|---|---|---|
| 3027755 | 2/1982 | Germany . |
| 3435995 | 4/1986 | Germany . |
| 4405460 | 8/1995 | Germany . |
| 2051524 | 1/1981 | United Kingdom . |

OTHER PUBLICATIONS

"Von Kabelfernsehen zur Kommunikation" in Funkschau, Jun. 1987, pp. 46—40.

*Primary Examiner*—Robert Pascal
*Assistant Examiner*—Khanh Van Nguyen
*Attorney, Agent, or Firm*—Ware, Fressola, Van Der Sluys & Adolphson LLP

[57] ABSTRACT

An intermediate amplifier device (20) with a signal amplification stage (21) in a transmission network in which signals can be transmitted from a central station (23) to a number of receivers (24) by way of a number of transmission lines, which are connected to one another in a tree structure, with a number of intermediate amplifier devices of the same type is characterized in that the intermediate amplifier device has a detection device (22) for detecting a malfunction (28) in the transmission line (27) connected to the intermediate amplifier device, a switching device (26) for coupling and uncoupling the transmission line (27) to or from the central station, as well as a delay element (25) with a delay time $t_i$ for the delayed reaction to a malfunction detected by the detection device (22) by means of a correspondingly delayed actuation of the switching device. As a result, in the event of a malfunction, only the last intermediate amplifier device before the malfunctioning line section as well as subsequent line parts possibly connected to it are affected, but not network sections that do not receive their signals by way of the affected intermediate amplifier device. Furthermore, the localization of the malfunction is made easier.

18 Claims, 2 Drawing Sheets

$t1 > t2 > t3$

INTERMEDIATE AMPLIFIER DEVICE FOR A TRANSMISSION NETWORK

TECHNICAL FIELD

The invention relates to an intermediate amplifier device with a signal amplification stage in a transmission network in which signals from a central station can be transmitted to a number of receivers by way of a number of transmission lines, which are preferably connected to one another in the BUS or tree structure, with a number of intermediate amplifier devices of the same type.

BACKGROUND OF THE INVENTION

Intermediate amplifier devices of this kind are known, for example, from DE 44 05 460 C1.

In transmission networks, for example in a CATV (cable television distribution network) with a tree structure, signals are transmitted from a central station to different end receivers by way of a number of transmission lines. In order to be able to transmit the signal at a sufficient signal level from the head-end station to the last receiver, mostly equidistant, in part automatically regulated, locally or remotely powered intermediate amplifiers are connected into the network for attenuation compensation, as described, for example, in the periodical "Funkschau" May 1987, pp. 46 to 50.

If a malfunction occurs in one of the transmission lines, for example a short circuit, then it is uncertain what the results in the network will be. For example, the intermediate amplifier disposed closest to the malfunction point can fail, as can an intermediate amplifier at another, more distant location in the network. Particularly with the tree-shaped branching structure of the transmission network described in DE 44 05 460 C1, with coaxial connection lines as point-to-multipoint connections between the central station and a large number of subscribers connected to the network, a local malfunction can possibly paralyze a larger part of the network or even the entire network. Furthermore, a central localization of the malfunction is quite difficult with the known network.

SUMMARY OF THE INVENTION

In contrast, the object of the current invention is to introduce an intermediate amplifier device of the type mentioned at the beginning, which produces the effect that in the event of a malfunction, only the last intermediate amplifier device before the malfunctioning line section as well as subsequent line parts possibly connected to it are affected, but not network sections that do not receive their signals by way of the affected intermediate amplifier device. In addition, the localization of the malfunction occurring should be made easier.

According to the invention, this object is attained by virtue of the fact that the intermediate amplifier device has a detection device for detecting a malfunction in the transmission line connected to the intermediate amplifier device, a switching device for coupling and uncoupling the transmission line to or from the central station, as well as a delay element with a delay time $t_i$ for the delayed reaction to a malfunction detected by the detection device by means of correspondingly delayed actuation of the switching device.

By providing a detection device, malfunctions that occur can be immediately detected and as a result of the detection device detecting it, can also be localized right away. By equipping the intermediate amplifier device with a delay element, the different intermediate amplifier devices can react to a malfunction with different reaction times. In the event of a malfunction, the affected part of the network can then be uncoupled so that the greatest possible portion of the network remains unaffected by the malfunction.

An embodiment of the intermediate amplifier device according to the invention is particularly preferable in which the delay time $t_i$ is less than the delay time of every intermediate amplifier device positioned closer to the central station and is greater than the delay time of every intermediate amplifier device of the transmission network positioned farther away from the central station.

The farther removed an intermediate amplifier is from the central station, the shorter the delay times of its delay elements are. As a result, in the event of a malfunction, the intermediate amplifier disposed closest to the malfunction point can instead be uncoupled between the malfunction point and the central station.

The spatial distance of the intermediate amplifier devices from one another is inconsequential. Only the sequence counts. In particular, based on the type of the currently existing signal (0 or 1), the intermediate amplifier device according to the invention can determine whether the detected malfunction stems from a network section between the intermediate amplifier device and the central station (signal=0) or stems from a network section that comes after the intermediate amplifier device, viewed from the central station (signal=1).

Preferably, the delay time $t_i$ of the delay element of an intermediate amplifier device according to the invention can be individually adjusted so that peculiarities in the network structure can be taken into consideration.

An embodiment of the invention is particularly preferable in which the detection device has a circuit connected to it, which upon detection of a malfunction, sends an acknowledgement signal to the central station.

This permits a central malfunction processing and elimination.

In a particularly advantageous improvement of this embodiment, the acknowledgement signal contains an identification of the acknowledging intermediate amplifier device so that the malfunction point can be immediately localized in conjunction with a network map in the central station.

In another advantageous embodiment, after the detection of a malfunction, the detection device can also detect its cessation and if need be, acknowledge this to the central station. To that end, it is necessary that even after the occurrence of a malfunction, the detection device is in a position to continue functioning and to observe the course of the malfunction.

In an improvement of this embodiment, the provision is made that after the cessation of the malfunction, the switching device can be actuated by means of a corresponding signal from the central station in such a way that the uncoupled transmission line is recoupled to the central station.

Alternative to this, however, the detection device can also have a circuit connected to it, which actuates the switching device after the cessation of the malfunction in such a way that the uncoupled transmission line is recoupled to the central station.

An intelligent circuit of this kind can currently be produced relatively easily and cheaply; as a result, when malfunctions are remedied, the load on the central station can be considerably eased by means of the decentralized sequence of automatic operations. Furthermore, the branch immediately after the malfunction remedy is switched on again and does not have to be brought into operation again in a complicated and delayed manner by means of an enable command.

In an improvement of the intermediate amplifier device according to the invention, the detection device can periodically introduce a test signal into the section of the transmission line affected by the malfunction in order to test whether the malfunction still exists. The test signal can either be generated in the intermediate amplifier device itself or can be emitted by the central station or another signal source connected to the transmission network.

Other advantages of the invention ensue from the description and the drawings. Likewise, according to the invention, the features mentioned above and further itemized below can be used individually or in a number of arbitrary combinations. The embodiments shown and described are not intended to be a conclusive list, but rather have an exemplary character for describing the invention.

BRIEF DESCRIPTION OF THE DRAWINGS

The invention is represented in the drawings and will be explained in more detail in conjunction with exemplary embodiments.

DETAILED DESCRIPTION OF THE PREFERRED EMBODIMENT

Figure 1A:
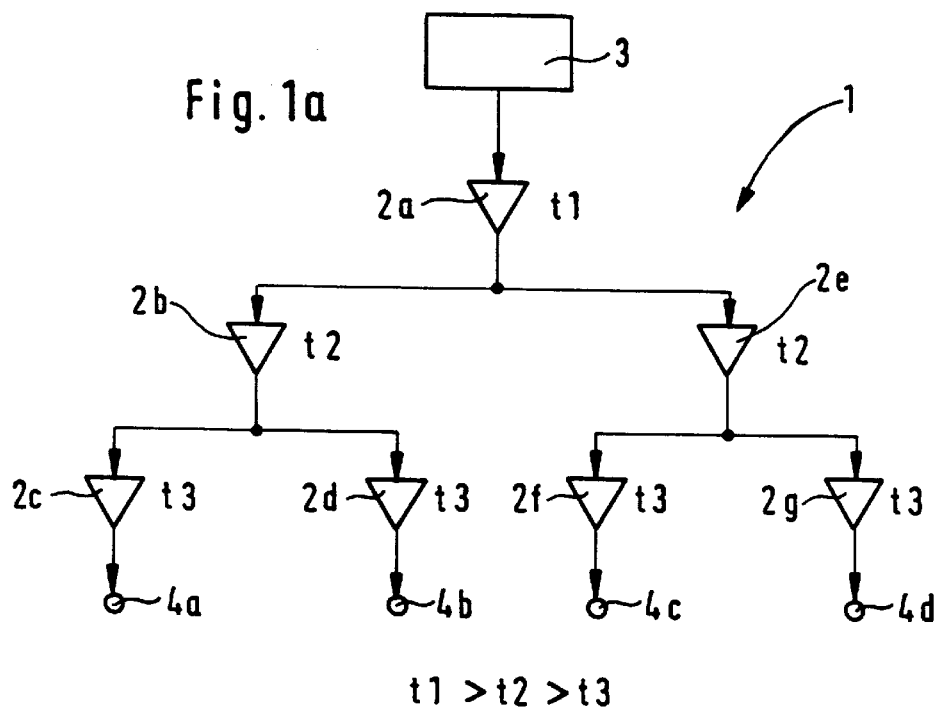
FIG. 1a is a schematic representation of a transmission network that has a symmetrical tree structure and intermediate amplifier devices according to the invention.

In the exemplary embodiment shown in FIG. 1a, in a transmission network 1 with a symmetrical tree structure, signals are transmitted from a central station 3 to a number of receivers 4a to 4d by way of intermediate amplifier devices 2a to 2g of the same type.

Figure 1B:
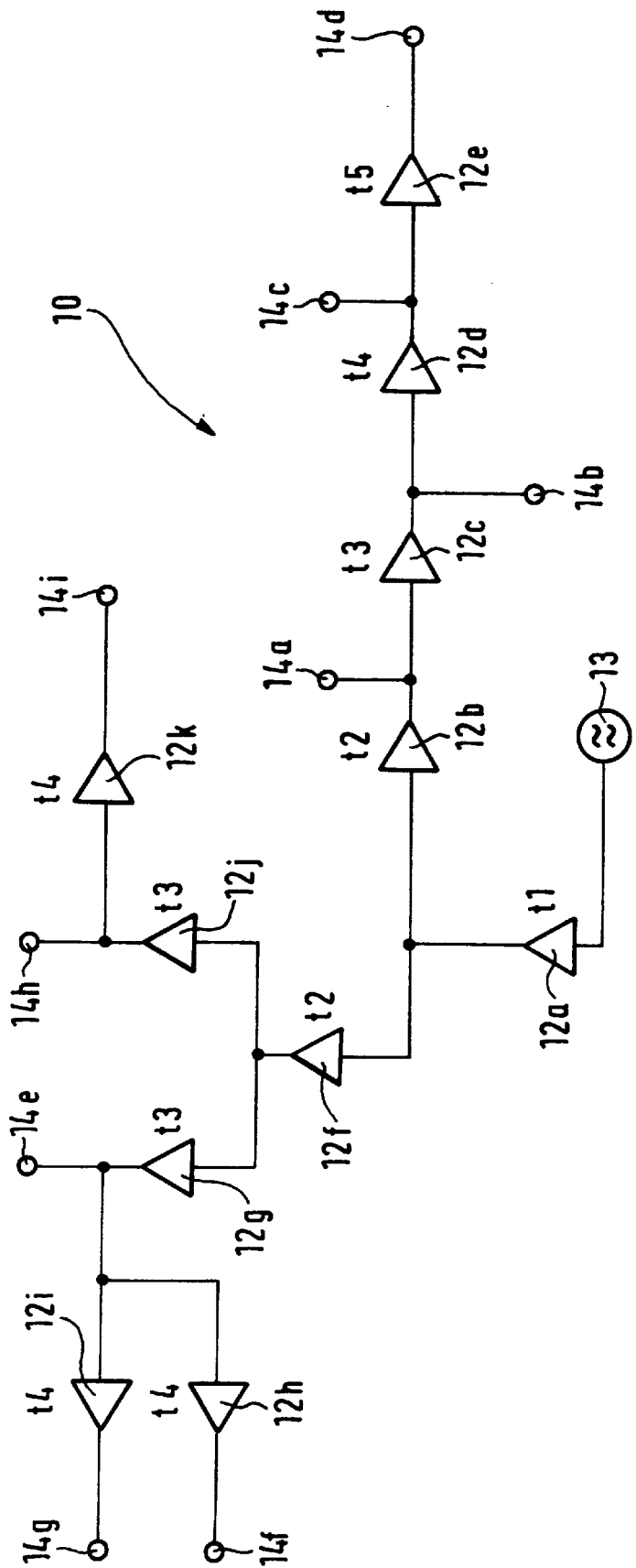
FIG. 1b shows an asymmetrical network structure.

Another possibility for a point-to-multipoint connection is shown with the transmission network represented in FIG. 1b. Here, too, a number of receivers 14a to 14i are supplied with signals from a central station 13, which travel by way intermediate amplifier devices 12a to 12k that are connected to one another by means of transmission lines.

Figure 2:
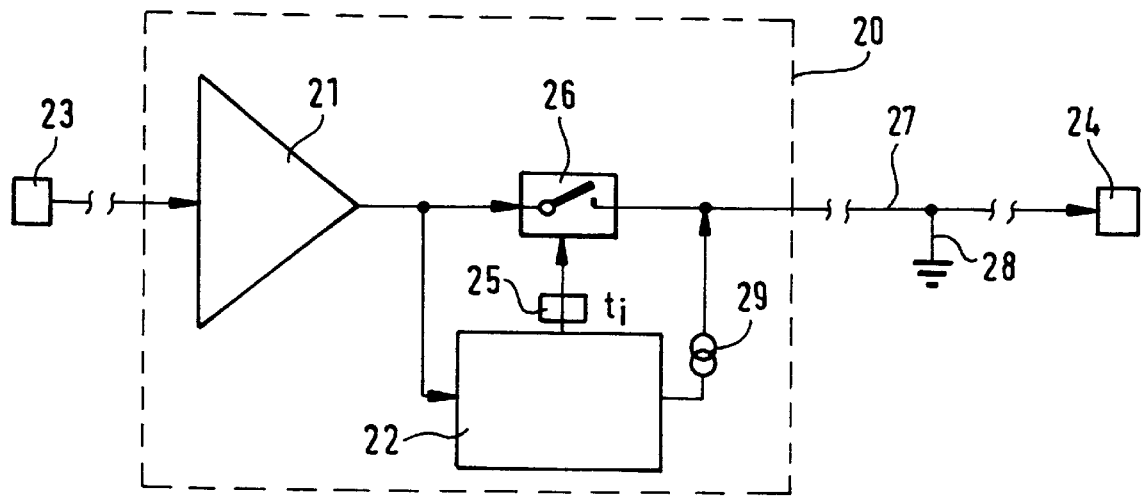
FIG. 2 is a schematic circuit diagram of an embodiment of the intermediate amplifier device according to the invention.

FIG. 2 is a detailed depiction of an embodiment of an intermediate amplifier device 20 according to the invention, of the type that can be used in transmission networks 1, 10. In addition to a signal amplification stage 21, the intermediate amplifier device 20 includes a detection device 22 for detecting a malfunction, for example a short circuit 28, in the transmission line 27 connected to the intermediate amplifier device 20, and signals are intended to be transported from the central station 23 to an end user 24 by way of this transmission line.

If the malfunction has been detected by the detection device 22, a switch 26 is opened with a time delay $t_i$ by way of a delay element 25, and this switch uncouples the transmission line 27 affected by the malfunction from the central station 23. The detection device 22 includes a circuit, not shown separately in the drawing, which upon detection of a malfunction, immediately sends an acknowledgement signal to the central station 23, which contains the identification of the intermediate amplifier device 20.

In order to determine whether the malfunction still exists, the detection device 22 periodically emits a test signal 29 into the affected section of the transmission line 27. As soon as the detection device detects the cessation of the malfunction, it actuates the switching device 26 by way of the delay element 25 in order to recouple the transmission line 27 to the central station 23.

Another possibility of malfunction processing is comprised in that the periodic test signals and the command to couple the affected line section after the cessation of the malfunction are sent directly from the central station 23 to the intermediate amplifier device 20.

In the event of a malfunction, for example a short circuit 28 in the transmission line 27, in order to assure that the entire transmission network 1, 10 is not paralyzed but only the smallest possible quantity of network sections is affected, the delay times $t_i$ of the intermediate amplifier devices 2a to 2g or 12a to 12k are adjusted in such a way that they become ever smaller with increasing distance from the central station 3, 13. In addition, the delay times $t_i$ can either be adjusted individually or can be fixed in accordance with the position in the transmission network 1, 10.

In the event of a malfunction, only the affected region of the damaged area is then isolated from the central station 3, 13, while the remaining parts of the transmission network 1, 10 can continue functioning unimpaired. If a malfunction occurs in the transmission network 10 represented in FIG. 1b, for example, between the intermediate amplifier devices 12d and 12c, then as a result of the selected delay times $t_2 > t_3$, first the intermediate amplifier device 12c and then the intermediate amplifier device 12d uncouple the subsequent line section from the central station 13. The remaining network parts with the intermediate amplifier devices 12a and 12f to 12k remain unaffected by the malfunction.

Due to the acknowledgement of the detection of a malfunction by one of the detection devices sent to the respective central station, the damaged area in the network can be immediately defined and localized, which is a prerequisite for a rapid remedy to the malfunction.

In the exemplary embodiments, the detection device, the switching device, and the delay element are integrated together with the signal amplifier stage into an intermediate amplifier device. Alternatively, a separate module can also be provided, which contains the detection device, the switching device, and the delay element, which follows or precedes the signal amplifier stage, or can be placed in an arbitrary location in the transmission network. As a result, the use of the module is independent of the intermediate amplifier device. Consequently, two modules can also be placed together, for example at a branching point in the transmission network, one module as a preceding module for the one branch, the other module as a preceding module for the other branch, for the case in which the transmission network branches in two directions at the branching point. If it branches in more than two directions, a corresponding number of modules can be placed together, for example one module for each direction.

What is claimed is:

1. An intermediate amplifier device with a signal amplification stage (21) in a transmission network (1; 10) in which signals can be transmitted from a central station (3; 13; 23) to a number of receivers (4a–4d; 14a–14i) by way of a number of transmission lines (27), which are preferably connected to one another in a BUS or tree structure, with a number of intermediate amplifier devices of the same type (2a–2g; 12a–12k), characterized in that each of the intermediate amplifier devices (2a–2g; 12a–12k; 20) has a detection device (22) for detecting a malfunction (28) in the transmission line (27) connected to the intermediate amplifier device (20), a switching device (26) for coupling and uncoupling the transmission line (27) to or from the central station (3; 13; 23), as well as a delay element (25) with a delay time $t_i$ for the delayed reaction to a malfunction (28) detected by the detection device (22) by means of correspondingly delayed actuation of the switching device (26).

2. The intermediate amplifier device according to claim 1, characterized in that the delay time $t_i$ is less than the delay time of each intermediate amplifier device positioned closer to the central station (3; 13; 23) and is greater than the delay time of each intermediate amplifier device of the transmission network (1; 10) disposed farther away from the central station (3; 13; 23).

3. The intermediate amplifier device according to claim 2, characterized in that the delay time $t_i$ of the delay element (25) can be adjusted individually.

4. The intermediate amplifier device according to claim 3, characterized in that the detection device (22) has a circuit connected to it, which emits an acknowledgement signal to the central station (23) upon detection of a malfunction (28).

5. The intermediate amplifier device according to claim 4, characterized in that the acknowledgement signal contains an identification of the acknowledging intermediate amplifier device (20).

6. The intermediate amplifier device according to claim 5, characterized in that after a malfunction (28) is detected, the detection device (22) can also detect its cessation and if need be, can acknowledge this to the central station (23).

7. The intermediate amplifier device according to claim 6, characterized in that after the cessation of the malfunction (28), the switching device (26) can be actuated by means of a corresponding signal from the central station (23) in such a way that the uncoupled transmission line (27) is recoupled to the central station (23).

8. The intermediate amplifier device according to claim 7, characterized in that the detection device (22) has a circuit connected to it, which after the malfunction (28) ceases, automatically actuates the switching device (26) in such a way that the uncoupled transmission line (27) is recoupled to the central station (23).

9. The intermediate amplifier device according to claim 8, characterized in that the detection device (22) can periodically or continuously emit a test signal (29) into the affected section of the transmission line (27) in order to detect the cessation of a malfunction (28).

10. A module comprising a detection device (22) coupled to a first transmission line (27) for detecting a malfunction (28) in the first transmission line (27) which transmits signals to an end user (24), a switching device (26) for coupling the first transmission line (27) to a second transmission line or uncoupling it from this second transmission line, as well as a delay element (25) with a delay time $t_i$ for the delayed reaction to a malfunction (28) determined by the detection device (22) by means of a corresponding delayed actuation of the switching device (26), wherein the malfunction (28) occurs at an affected section which is located between the end user (24) and the switching device (26).

11. The intermediate amplifier device according to claim 1, characterized in that the delay time $t_i$ of the delay element (25) can be adjusted individually.

12. The intermediate amplifier device according to claim 1, characterized in that the detection device (22) has a circuit connected to it, which emits an acknowledgement signal to the central station (23) upon detection of a malfunction (28).

13. The intermediate amplifier device according to claim 12, characterized in that the acknowledgement signal contains an identification of the acknowledging intermediate amplifier device (20).

14. The intermediate amplifier device according to claim 1, characterized in that after a malfunction (28) is detected, the detection device (22) can also detect its cessation and if need be, can acknowledge this to the central station (23).

15. The intermediate amplifier device according to claim 14, characterized in that after the cessation of the malfunction (28), the switching device (26) can be actuated by means of a corresponding signal from the central station (23) in such a way that the uncoupled transmission line (27) is recoupled to the central station (23).

16. The intermediate amplifier device according to claim 15, characterized in that the detection device (22) has a circuit connected to it, which after the malfunction (28) ceases, automatically actuates the switching device (26) in such a way that the uncoupled transmission line (27) is recoupled to the central station (23).

17. The intermediate amplifier device according to claim 7, characterized in that the detection device (22) can periodically or continuously emit a test signal (29) into the affected section of the transmission line (27) in order to detect the cessation of a malfunction (28).

18. A module comprising a detection device (22) for detecting a malfunction (28) occurring at an affected section in a first transmission line (27), a switching device (26) for coupling the first transmission line (27) to a second transmission line or uncoupling it from this second transmission line, as well as a delay element (25) with a delay time $t_i$ for the delayed reaction to a malfunction (28) determined by the detection device (22) by means of a corresponding delayed actuation of the switching device (26), wherein the detection device (22) periodically or continuously emits a test signal (29) into the affected section of the transmission line (27) in order to detect cessation of the malfunction.

* * * * *